United States Patent
Totani

(10) Patent No.: US 10,388,824 B2
(45) Date of Patent: Aug. 20, 2019

(54) METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 16/041,573

(22) Filed: Jul. 20, 2018

(65) Prior Publication Data

US 2019/0067511 A1 Feb. 28, 2019

(30) Foreign Application Priority Data

Aug. 31, 2017 (JP) ................. 2017-168076

(51) Int. Cl.
| | |
|---|---|
| *H01L 33/00* | (2010.01) |
| *H01L 33/38* | (2010.01) |
| *H01L 33/46* | (2010.01) |
| *H01L 33/62* | (2010.01) |
| *H01L 33/42* | (2010.01) |
| *H01L 33/40* | (2010.01) |

(52) U.S. Cl.
CPC ............ *H01L 33/007* (2013.01); *H01L 33/38* (2013.01); *H01L 33/387* (2013.01); *H01L 33/42* (2013.01); *H01L 33/46* (2013.01); *H01L 33/62* (2013.01); *H01L 33/405* (2013.01); *H01L 2933/0016* (2013.01)

(58) Field of Classification Search
CPC ..... H01L 33/007; H01L 33/387; H01L 33/42; H01L 33/62; H01L 33/38; H01L 33/46; H01L 2933/0016; H01L 33/405
See application file for complete search history.

(56) References Cited

U.S. PATENT DOCUMENTS 8,247,823 B2   8/2012  Yahata et al.
2008/0315240 A1* 12/2008 Kim ................ H01L 33/20
                                           257/99

(Continued)

FOREIGN PATENT DOCUMENTS

| JP | 5152133 B2 | 2/2013 |
|---|---|---|
| JP | 2015-530755 A | 10/2015 |
| WO | WO 2014/048988 A1 | 4/2014 |

*Primary Examiner* — John P. Dulka

(74) *Attorney, Agent, or Firm* — McGinn IP Law Group, PLLC

(57) ABSTRACT

An n-side flattening electrode and a p-side flattening electrode are formed apart from each other on a predetermined region on an insulating film. Recesses are formed according to the level difference due to holes on the surfaces of the n-side flattening electrode and the p-side flattening electrode. Subsequently, the surfaces of the n-side flattening electrode and the p-side flattening electrode are ground until the surfaces become flat. After removal of oxide film, an n-side junction electrode and a p-side junction electrode are formed on the n-side flattening electrode and the p-side flattening electrode, respectively. Since the surfaces of the n-side flattening electrode and the p-side flattening electrode are flattened, the surfaces of the n-side junction electrode and the p-side junction electrode become flat so that the thickness is uniform.

13 Claims, 5 Drawing Sheets

(56) References Cited

U.S. PATENT DOCUMENTS

| | | | |
|---|---|---|---|
| 2011/0068359 A1* | 3/2011 | Yahata | H01L 33/382 |
| | | | 257/98 |
| 2013/0306976 A1* | 11/2013 | Haruta | H01L 33/32 |
| | | | 257/76 |
| 2014/0131758 A1* | 5/2014 | Shinohara | H01L 33/382 |
| | | | 257/99 |
| 2015/0255685 A1* | 9/2015 | Herrmann | H01L 33/0079 |
| | | | 257/98 |
| 2017/0077173 A1* | 3/2017 | Boyama | H01L 27/156 |
| 2017/0200873 A1* | 7/2017 | Nakabayashi | H01L 33/005 |
| 2017/0345971 A1* | 11/2017 | Ide | H01L 33/42 |
| 2018/0145227 A1* | 5/2018 | Totani | H01L 33/44 |
| 2019/0067511 A1* | 2/2019 | Totani | H01L 33/007 |

\* cited by examiner

METHOD FOR PRODUCING LIGHT-EMITTING DEVICE

BACKGROUND OF THE INVENTION

Field of the Invention

The present invention relates to a method for producing a light-emitting device having a junction electrode.

Background Art

In a flip-chip type light-emitting device, a junction electrode is formed on an n-electrode and a p-electrode, and the junction electrode is bonded to a junction electrode on a package side by heating and pressing or using Au bump.

Japanese Patent No. 5152133 discloses a light-emitting device having a structure in which n-electrode or p-electrode are formed in a plurality of dots, an insulating film and a junction electrode are sequentially deposited on the n-electrode or the p-electrode, and the n-electrode and the p-electrode are connected to the junction electrode via holes formed in the insulating film.

Japanese Translation of PCT International Application Publication No. 2015-530755 discloses a structure in which a junction electrode is formed on an insulating film, and an n-type layer or a p-type layer are connected to the junction electrode via holes formed in the insulating film. Recesses are formed at the holes on the surface of the junction electrode, and the recesses are removed by flattening the junction electrode.

When the junction electrode has recesses, the light-emitting device is partially unbonded to the package, causing peeling off of the light-emitting device from the package. This is often observed in the structure of the light-emitting device of Japanese Patent No. 5152133.

Japanese Translation of PCT International Application Publication No. 2015-530755 discloses that the junction electrode is flattened. However, a specific method is not disclosed.

SUMMARY OF THE INVENTION

In view of the foregoing, an object of the present invention is to reduce the unbonded portions of the junction electrode when the light-emitting device is mounted on the package.

In an aspect of the present invention, there is provided a method for producing a light-emitting device comprising a semiconductor layer formed by sequentially depositing an n-type layer, a light-emitting layer, and a p-type layer, an insulating film formed on the semiconductor layer, and an n-side junction electrode and a p-side junction electrode formed on the insulating film, wherein the n-type layer is connected to the n-side junction electrode via n-side holes formed in the insulating film and the semiconductor layer, and the p-type layer is connected to the p-side junction electrode via p-side holes formed in the insulating film. The production method includes a flattening electrode formation step of forming an n-side flattening electrode being connected to the n-type layer via the n-side holes and a p-side flattening electrode being connected to the p-type layer via the p-side holes so as to be apart from each other on the insulating film, a grinding step of grinding and flattening a surface of the n-side flattening electrode and a surface of the p-side flattening electrode, and a junction electrode formation step of forming an n-side junction electrode on the surface of the n-side flattening electrode and a p-side junction electrode on the surface of the p-side flattening electrode, respectively.

In the grinding step, the recesses on the surfaces of the n-side flattening electrode and the p-side flattening electrode are ground so as to have a depth of 100 nm or less. When the light-emitting device of the present invention is mounted on the package, the unbonded portions of the n-side junction electrode and the p-side junction electrode can be further reduced.

Before the junction electrode formation step after the grinding step, the production method may include an oxide film removal step of removing an oxide film formed on the surface of the n-side flattening electrode and an oxide film formed on the surface of the p-side flattening electrode by irradiating the surface of the n-side flattening electrode and the surface of the p-side flattening electrode with a reducing gas plasma. Adhesion between the n-side flattening electrode and the n-side junction electrode and between the p-side flattening electrode and the p-side junction electrode, can be improved by removing the oxide films formed due to heat generated by grinding.

The production method may further include an antioxidation film formation step of forming an antioxidation film on a surface of the n-side junction electrode and an antioxidation film on the p-side junction electrode. This can suppress bonding defect.

The n-side flattening electrode and the p-side flattening electrode are preferably formed so as to have a thickness twice or more a height from a surface of the p-type layer to a surface of the insulating film. The surfaces of the n-side flattening electrode and the p-side flattening electrode can be sufficiently ground and further flattened.

According to the method for producing a Group III nitride semiconductor light-emitting device of the present invention, the unbonded portions of the n-side junction electrode and the p-side junction electrode can be reduced, and peeling off of the light-emitting device from the package can be reduced. Moreover, the thermal resistance is lowered, thereby extending the service life of the device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiment.

Embodiment 1

Figure 1:
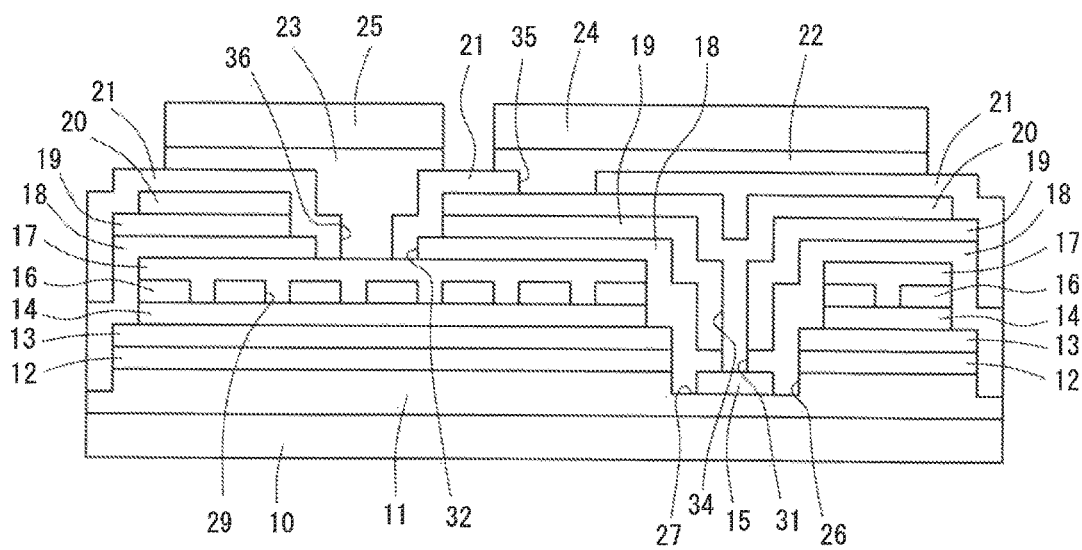
FIG. 1 shows the structure of a light-emitting device according to Embodiment 1.

FIG. 1 shows the structure of a flip-chip type light-emitting device according to Embodiment 1. As shown in FIG. 1, the light-emitting device according to Embodiment 1 includes: a substrate 10; an n-type layer 11, a light-emitting layer 12, and a p-type layer 13 sequentially deposited on the substrate 10; and a transparent electrode 14 formed on the p-type layer 13. The light-emitting device according to Embodiment 1 also includes n-dot electrodes 15 on the n-type layer 11 exposed by holes, a DBR layer 16 on the transparent electrode 14, a p-electrode 17 on the DBR layer 16, and an insulating film 18 covering the n-dot electrodes 15 and the p-electrode 17. Moreover, a reflection film 19 is formed on the insulating film 18, an n-wiring electrode 20 is formed on the reflection film 19, and an insulating film 21 is formed so as to cover the n-wiring electrode 20. An n-side flattening electrode 22 and a p-side flattening electrode 23 are formed so as to be apart from each other on the insulating film 21, the n-side flattening electrode 22 is connected to the the n-wiring electrode 20 via holes formed in the insulating film 21, and the p-side junction electrode 23 is connected to the p-electrode 17. Moreover, an n-side junction electrode 24 is formed on the n-side flattening electrode 22, and a p-side junction electrode 25 is formed on the p-side flattening electrode 23.

The light-emitting device according to Embodiment 1, is flip chip mounted on the package. That is, with the electrode side of the light-emitting device facing downward (package side), the n-side junction electrode 24 and the p-side junction electrode are bonded to the junction electrode on the package side by heating and pressing or using Au bump. The rear surface of the substrate 10 (the surface opposite to the n-type layer 11 side) as a top surface is a light extraction surface.

Next will be described the components of the light-emitting device according to Embodiment 1.

(Structure of Substrate 10)

The substrate 10 is a growth substrate for forming a Group III nitride semiconductor on the main surface thereof. The substrate 10 is made of GaN. The rear surface of the substrate 10 (the surface opposite to the n-type layer 11 side) has an uneven shape (not illustrated), thereby improving the light extraction efficiency. The substrate 10 may be made of a material other than GaN, for example, sapphire, Si, SiC, and ZnO.

(Structure of Semiconductor Layer)

The semiconductor layer (the n-type layer 11, the light-emitting layer 12, and the p-type layer 13) may have any structure conventionally employed. For example, the n-type layer 11 has a structure in which an n-GaN n-type contact layer, a high electrostatic breakdown voltage layer formed by sequentially depositing undoped GaN and n-GaN, an n-type superlattice layer formed by alternately and repeatedly depositing n-GaN and InGaN, are sequentially deposited. The light-emitting layer 12 has a MQW structure in which a plurality of layer units are repeatedly deposited, each layer unit comprising an InGaN well layer, a GaN or AlGaN capping layer, and an AlGaN barrier layer sequentially deposited. The p-type layer 13 has a structure in which a p-type cladding layer formed by alternately and repeatedly depositing p-AlGaN and p-InGaN and a p-GaN p-type contact layer are sequentially deposited.

The p-type layer 13 has a plurality of dotted holes 26 with a depth reaching the n-type layer 11 in a predetermined area of the surface thereof. The holes 26 are provided to expose the surface 27 of the n-type layer 11 in order to form the n-dot electrodes 15.

(Structure of Transparent Electrode 14)

The transparent electrode 14 is formed on the p-type layer 13. The transparent electrode 14 is made of IZO (Zinc-doped Indium Oxide). Other conductive oxide such as ITO (Tin-doped Indium Oxide) or ICO (Cerium-doped Indium Oxide) may be used.

(Structure of DBR Layer 16)

The DBR layer 16 is formed on almost the entire surface of the transparent electrode 14. The DBR layer 16 is a dielectric multilayer film (DBR) formed by alternately and repeatedly dielectrics with different refractive indices in a predetermined film thickness, and a reflection film using the interference of light. The DBR layer 16 reflects a light emitted from the light-emitting layer 12 to the side opposite to the light extraction side (the rear surface side of the GaN substrate 10) toward the light extraction side, thereby enhancing the light extraction efficiency. In Embodiment 1, $SiO_2$ and $TiO_2$ are used. Needless to say, other material may be used.

(Structure of p-electrode 17)

The p-electrode 17 is formed on almost the entire surface of the DBR layer 16. The DBR layer 16 has a plurality of dotted holes 29, and the transparent electrode 14 is exposed in the bottom surfaces of the holes 29. The p-electrode 17 is formed so as to fill in the holes 29, and the transparent electrode 14 and the p-electrode 17 are connected in a dotted form. The p-electrode 17 is formed of IZO/Ag/Ti/Au/Al wherein the symbol "/" refers to a layered structure; for example, "A/B" refers to a layered structure in which layer B is formed after formation of layer A (the same shall apply hereinafter). The layers of the p-electrode 17 respectively have a thickness of 1 nm, 100 nm, 200 nm, 1500 nm, and 10 nm in order from the DBR layer 16 side. The light emitted from the light-emitting layer 12 is reflected toward the light extraction side by the p-electrode 17, thereby improving the light extraction efficiency.

(Structure of n-dot Electrode 15)

The n-dot electrodes 15 are formed on the n-type layer 11 exposed in the bottom surface of the hole 26 formed in the semiconductor layer. The n-dot electrode 15 is formed of Ti/Al/Ti/Au/Al, and the layers of the n-dot electrode 15 respectively have a thickness of 2 nm, 100 nm, 200 nm, 500 nm, and 10 nm in order from the n-type layer 11.

(Structure of Insulating Film 18)

The insulating film 18 is formed so as to cover the p-electrode 17 and the n-dot electrodes 15. The insulating film 18 is made of $SiO_2$, and has a thickness of 300 nm. Holes 31 and holes (p-side holes) 32 are formed in a predetermined region of the insulating film 18 (the regions above the n-dot electrodes 15 and the p-electrode 17). These holes 31 and 32 are provided to electrically conduct between the n-dot electrodes 15 and the n-side junction electrode 24 and between the p-electrode 17 and the p-side junction electrode 25.

(Structure of n-wiring Electrode 20)

The n-wiring electrode 20 is formed in a wiring pattern on the reflection film 19, and the n-dot electrodes 15 and the n-wiring electrodes 20 are connected via holes 34 and A formed in the reflection film 19 and the insulating film 18. The n-wiring electrode 20 is formed of Ti/Au/Al, and the layers of the n-wiring electrode 20 have a thickness of 50 nm, 1500 nm, and 10 nm in order from the reflection film 19 side. A reflection film 19 is formed between the n-wiring electrode 20 and the insulating film 18. The reflection film 19 reflects the light toward the light extraction side and reduces the light absorbed by the n-wiring electrode 20, thereby improving the light extraction efficiency.

In Embodiment 1, the n-dot electrode 15 is provided to make good contact with the n-type layer 11. However, the n-type layer 11 and the n-wiring electrode 20 may be directly connected via holes 34 and 31 formed in the reflection film 19 and the insulating film 18 without forming the n-dot electrodes 15 by forming the n-wiring electrode 20 of a material that can make good contact with the n-type layer 11.

(Structure of Insulating Film 21)

The insulating film 21 is formed so as to cover the insulating film 18 and the n-wiring electrode 20. The insulating film 21 is made of $SiO_2$, and has a thickness of 300 nm. A hole (n-side holes) 35 is formed in the insulating film 21. The hole 35 is in a region above the n-wiring electrode 20. The n-wiring electrode 20 is exposed in the bottom surface of the hole 35. This hole 35 is provided to electrically conduct between the n-wiring electrode 20 and the n-side junction electrode 24. A hole 36 is also formed in the insulating film 21. The hole 36 is in a region above the hole 32 which is formed in the insulating film 18 for electrically conducting with the p-side junction electrode 25. The p-electrode 17 is exposed in the bottom surface of the hole 36. This hole 36 is provided to electrically conduct between the p-electrode 17 and the p-side junction electrode 25.

(Structures of n-side Flattening Electrode 22 and p-side Flattening Electrode 23)

The n-side flattening electrode 22 and the p-side flattening electrode 23 are formed so as to be apart from each other on the insulating film 21. The n-side flattening electrode 22 and the n-wiring electrode 20 are connected via the hole 35 passing through the insulating film 21. The p-side flattening electrode 23 and the p-electrode 17 are connected via the hole 36 passing through the insulating film 21 and the insulating film 18. The n-side flattening electrode 22 and the p-side flattening electrode 23 are formed of Ti/Au. Al or Cu may be used other than Au, and the n-side flattening electrode 22 and the p-side flattening electrode 23 are formed preferably via a Ti layer to improve the adhesion. However, when Al is used, the n-side flattening electrode 22 and the p-side flattening electrode 23 may be formed directly on the insulating film 21 without using the Ti layer.

The surfaces of the n-side flattening electrode 22 and the p-side flattening electrode 23 are flat with no recesses. The height from the surface of the substrate 10 to the surface of the n-side flattening electrode 22 is the same as the height from the surface of the substrate 10 to the surface of the p-side flattening electrode 23. That is, the surface of the n-side flattening electrode 22 is flush with the surface of the p-side flattening electrode 23.

The surfaces of the n-side flattening electrode 22 and the p-side flattening electrode 23 are flattened by grinding after once forming along the shape of the insulating film 21. As a result, the thickness is uneven. The regions corresponding to the holes 35 and 36 formed in the insulating film 21 have a thickness larger than the thickness of other region.

The surfaces of the n-side flattening electrode 22 and the p-side flattening electrode 23 need not be completely flattened, and may be flattened to such an extent that the portions not bonded to the package are reduced in the surfaces of the n-side junction electrode 24 and the p-side junction electrode 25 when the light-emitting device is bonded on the package. The depth of the recess on the surfaces of the n-side flattening electrode 22 and the p-side flattening electrode 23 (the largest depth if there are a plurality of recesses) is preferably 100 nm or less. If the depth is 100 nm or less, the portions not bonded to the package of the n-side junction electrode 24 and the p-side junction electrode 25 can be eliminated. The depth is more preferably, 50 nm or less, and further preferably, 30 nm or less.

(Structures of n-side Junction Electrode 24 and p-side Junction Electrode 25)

The n-side junction electrode 24 is formed on the n-side flattening electrode 22, and the p-side junction electrode 25 is formed on the p-side flattening electrode 23. The n-side junction electrode 24 and the p-side junction electrode 25 are formed of Ti/Pt/AuSn/Au, and the layers have a thickness of 300 nm, 100 nm, 2000 nm, 50 nm respectively in order from the n-side flattening electrode 22 side and the p-side flattening electrode 23 side. The n-side junction electrode 24 and the p-side junction electrode 25 have an uniform thickness, and the surfaces of the n-side junction electrode 24 and the p-side junction electrode 25 are flat. The surface of the n-side junction electrode 24 is flush with the surface of the p-side junction electrode 25.

The surfaces of the n-side junction electrode 24 and the p-side junction electrode 25 need not be completely flattened, and may be flattened to such an extent that the portions not bonded to the package are reduced in the surfaces of the n-side junction electrode 24 and the p-side junction electrode 25 when the light-emitting device is bonded on the package. The depth of the recess on the surfaces of the n-side junction electrode 24 and the p-side junction electrode 25 is preferably 100 nm or less, more preferably, 50 nm or less, and further preferably, 30 nm or less.

In the light-emitting device according to Embodiment 1, the n-side junction electrode 24 and the p-side junction electrode 25 are formed of AuSn to be bonded to the package by heating and pressing. When bonding by using Au bump, Au is used instead of AuSn.

An antioxidation film may be formed on the n-side junction electrode 24 and the p-side junction electrode 25. This can suppress bonding defect due to the formation of the oxide film. The antioxidation film may be formed of any non-natural oxidizable material, for example, Au.

Production Processes for Light-Emitting Device According to Embodiment 1

The production processes for the light-emitting device according to Embodiment 1 will next be described with reference to FIGS. 2A to 4C.

Figure 2A:
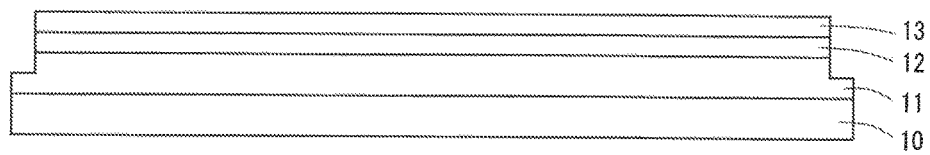
FIGS. 2A to 2E are sketches showing production processes of the light-emitting device according to Embodiment 1.
Figure 2B:
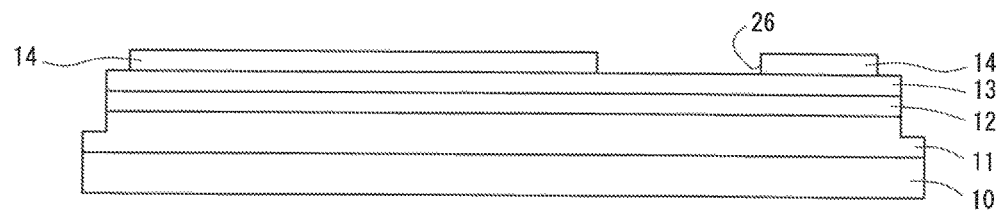
Figure 2C:
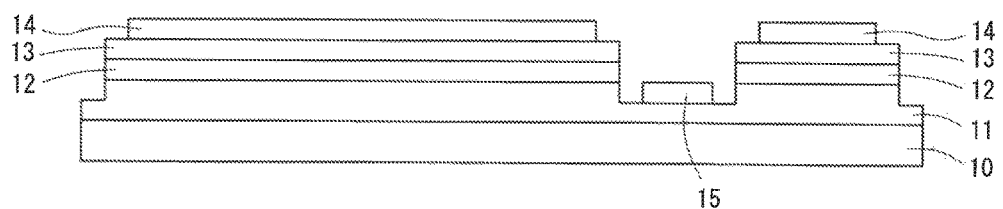
Figure 2D:
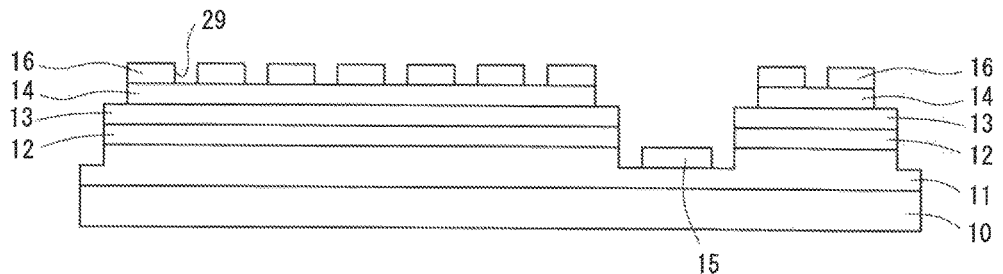
Figure 2E:
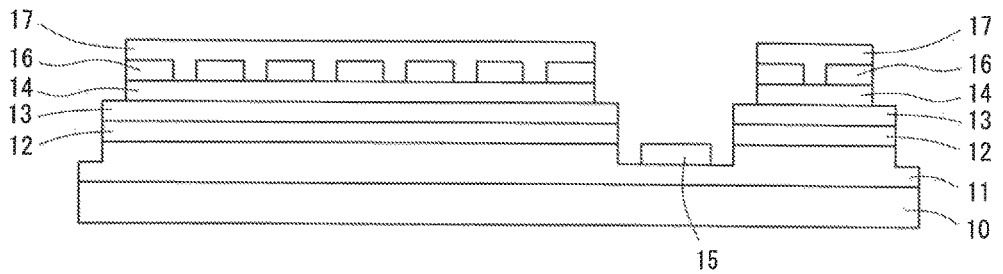

Firstly, an n-type layer 11, a light-emitting layer 12, and a p-type layer 13 are sequentially deposited through MOCVD on the front surface of a GaN substrate having an uneven shape on the rear surface thereof (refer to FIG. 2A). The raw material gases employed for MOCVD are as follows: TMG (trimethylgallium) as a Ga source, TMA (trimethylaluminum) as an Al source, TMI (trimethylindium) as an In source, ammonia as an N source, bis(cyclopentadienyl)magnesium as a p-type dopant gas, and silane as an n-type dopant gas. Hydrogen and nitrogen are used as a carrier gas.

Subsequently, a transparent electrode 14 is formed on a predetermined region on the p-type layer 13. The resistance of the transparent electrode 14 is reduced by performing heat treatment at 650° C. under reduced pressure atmosphere after an IZO film is formed by sputtering. An opening pattern of a region for forming the n-dot electrodes 15 in the subsequent step is formed by photolithography and wet etching (refer to FIG. 2B).

Next, dotted holes 26 and device separation groove are formed by dry etching from the surface of the p-type layer 13 exposed in the opening, to expose the n-type layer 11 in the bottoms of the holes 26. The n-dot electrodes 15 are formed on the thus-exposed n-type layer 11 through vapor deposition and lift-off (refer to FIG. 2C).

A DBR layer 16 is uniformly formed on the entire top surface of the device by vapor deposition. Predetermined regions (the top of the transparent electrode 14 and the top of the n-dot electrodes 15) are opened by photolithography and dry etching. The transparent electrode 14 and the n-dot electrodes 15 are exposed in the bottoms of the holes 29 and 26, respectively (refer to FIG. 2D).

A p-electrode 17 is formed by vapor deposition and lift off on the DBR layer 16. The p-electrode 17 is formed so as to fill in the holes 29 opened in the DBR layer 16, thereby bringing the p-electrode 17 into contact with the transparent electrode 14 in a dot pattern via the holes 29 opened in the DBR layer 16 (refer to FIG. 2E).

An insulating film 18 is formed through CVD on the p-electrode 17 and the n-dot electrodes 15. Holes 31 and 32 are formed by photolithography and dry etching in predetermined regions (for electrically conducting with the n-side junction electrode 24 and the p-side junction electrode 25) (refer to FIG. 3A).

Figure 3A:
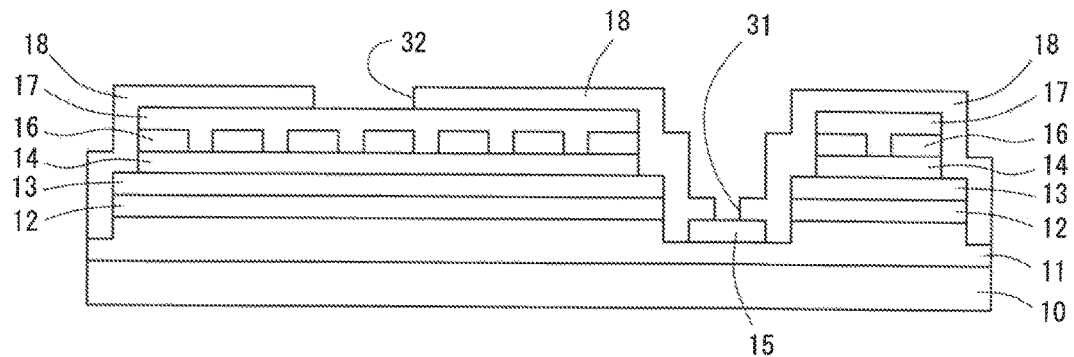
FIGS. 3A to 3C are sketches showing production processes of the light-emitting device according to Embodiment 1.
Figure 3B:
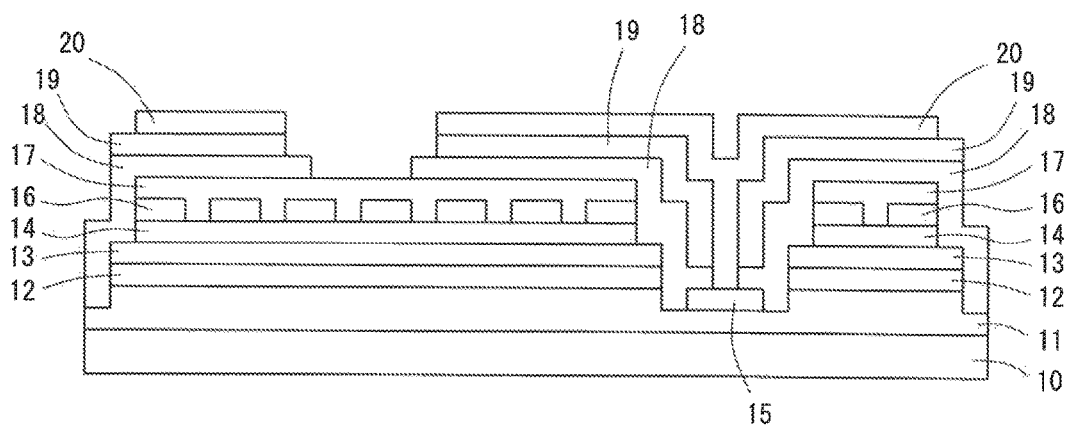

A predetermined patterned reflection film 19 and an n-wiring electrode 20 are sequentially formed by vapor deposition and lift-off on a predetermined region of the insulating film 18 (refer to FIG. 3B). The n-wiring electrode 20 is connected to the n-dot electrodes 15 via the holes 31 formed in the insulating film 18.

Figure 3C:
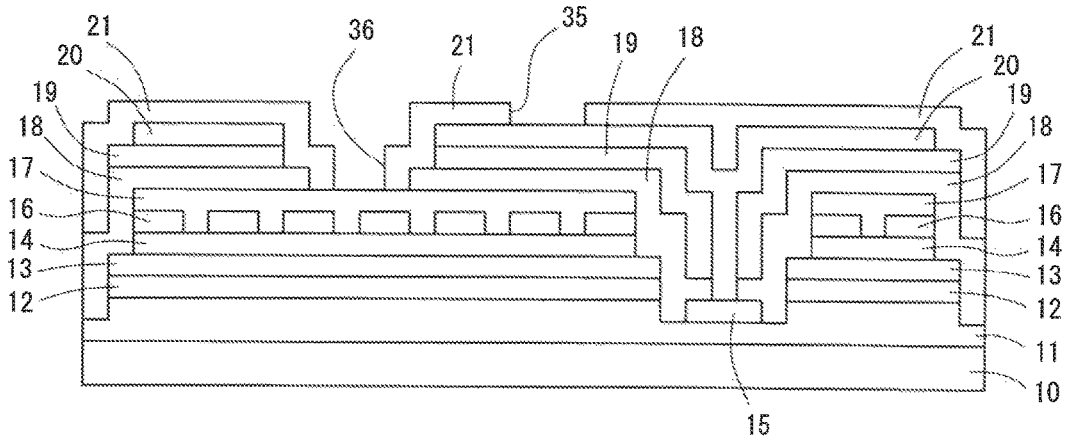

An insulating film 21 is uniformly formed through CVD on the entire surface of the device, i.e., the n-wiring electrode 20 and the insulating film 18, and holes 35 and 36 are formed by photolithography and dry etching in predetermined regions (for electrically conducting with the n-side junction electrode 24 and the p-side junction electrode 25)(refer to FIG. 3C).

Figure 4A:
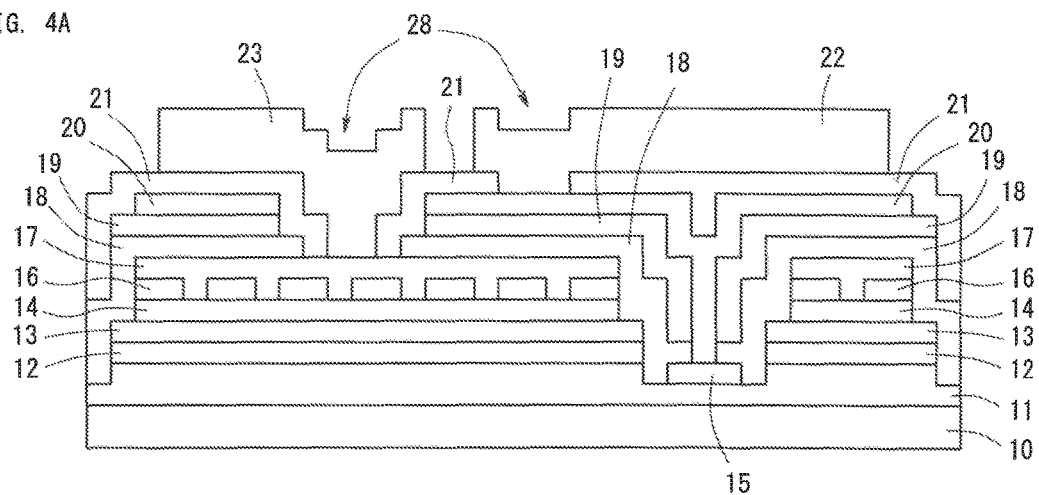
FIGS. 4A to 4C are sketches showing production processes of the light-emitting device according to Embodiment 1.

An n-side flattening electrode 22 and a p-side flattening electrode 23 are formed so as to be apart from each other by vapor deposition and lift off on a predetermined region of the insulating film 21. Since holes 35 and 36 are formed in the insulating film 21, the n-side flattening electrode 22 and the p-side flattening electrode 23 are respectively connected to the n-wiring electrode 20 and the p-electrode 17 at the holes 35 and 36. The n-side flattening electrode 22 and the p-side flattening electrode 23 are formed so as to have an uniform thickness. However, recesses 28 are formed according to the level difference due to the holes 35 and 36 on the surfaces of the n-side flattening electrode 22 and the p-side flattening electrode 23 (refer to FIG. 4A). Specifically, recesses 28 are formed in regions above the n-dot electrodes 15, the holes 29 formed in the DBR layer 16, and the holes 35 and 36 formed in the insulating film 21. FIG. 4A shows only the recesses 28 in the regions above the holes 35 and 36 formed in the insulating film 21 and the recesses 28 in other regions are omitted (not illustrated).

The n-side flattening electrode 22 and the p-side flattening electrode 23 are preferably formed so as to have a thickness twice or more the height from the surface of the p-electrode 17 to the surface of the insulating film 21. The thickness is enough to grind the n-side flattening electrode 22 and the p-side flattening electrode 23 in the subsequent step, thereby sufficiently reducing the depth of the recesses 28 of the n-side flattening electrode 22 and the p-side flattening electrode 23. The thickness of the n-side flattening electrode 22 and the p-side flattening electrode 23 is more preferably two times to ten times, and further preferably, two times to five times the height from the surface of the p-electrode 17 to the surface of the insulating film 21.

The n-side flattening electrode 22 and the p-side flattening electrode 23 may be formed by sputtering or printing other than vapor deposition. The n-side flattening electrode 22 and the p-side flattening electrode 23 need to be formed so as to have a thickness of approximately 5 μm to 10 μm. Such a thickness can be easily achieved by printing. In the case of vapor deposition or sputtering, cooling time is required so as not to prevent the resist used in lift-off from being deteriorated due to heat. Thus, it takes a long time to achieve such a thickness. Since the rigidity is increased as the thickness of the electrodes 22 and 23 increases, there are cases that stepped-cut of the electrodes 22 and 23 is not performed well in lift-off, and therefore, pattern formation is difficult. On the other hand, in the case of printing, a thick film pattern can be easily formed using a metal paste or a metal nano-ink, thereby reducing the formation time and pattern defects.

When the n-side flattening electrode 22 and the p-side flattening electrode 23 are formed by printing, firstly Ti/Au is formed as a base layer by vapor deposition or sputtering, and patterning is performed by lift-off. Ti is used to improve adhesion with the insulating film 21, and Au is used to improve adhesion with a metal paste or a metal nano-ink.

Subsequently, a metal paste or a metal nano-ink is applied in a predetermined pattern by printing on the base layer. Screen printing or inkjet printing may be used, however, screen printing is simple and preferable. Au, Cu, or the like may be used as a metal of metal paste or metal nano-ink. In terms of reliability, Au is preferably used. When Cu is used, Au as a base layer may be omitted.

The solvent contained in the metal paste or the metal nano-ink is evaporated by heating, and the binder is carbonized. After that, the residue of the solvent is removed by washing. From the above, thick film n-side flattening electrode 22 and p-side flattening electrode 23 can be formed with good pattern accuracy in a short time.

Figure 4B:
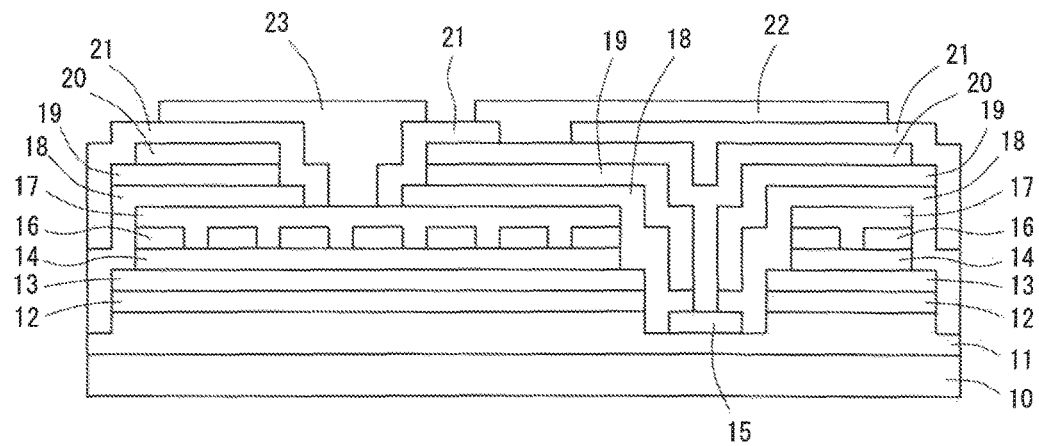

The surfaces of the n-side flattening electrode 22 and the p-side flattening electrode 23 are ground until the surfaces become flat (refer to FIG. 4B). For example, the n-side flattening electrode 22 and the p-side flattening electrode 23 are preferably ground so that the recesses 28 on the surfaces thereof have a depth of 100 nm or less. Mechanical grinding does not depend on the materials of the n-side flattening electrode 22 and the p-side flattening electrode 23, and the grinding thickness can be easily set. Grinding may be performed with a diamond bit or a grinding stone, and by these grinding methods, the grinding thickness can be easily and accurately controlled.

The surfaces of the n-side flattening electrode 22 and the p-side flattening electrode 23 are ground to be flat, resulting in uneven thicknesses distribution of the n-side flattening electrode 22 and the p-side flattening electrode 23, that is, the thickness is large in a region above the recesses 28 and smaller in other regions. The thickness of other regions is enough if the insulating film 21 is not exposed. However, the thickness is preferably 100 nm or more to stably form the n-side junction electrode 24 or the p-side junction electrode 25 in the subsequent step.

In this grinding step, the arithmetic average roughness Ra of the surfaces of the n-side flattening electrode 22 and the p-side flattening electrode 23, is preferably 50 nm or less.

Thus, the surface unevenness of the n-side junction electrode 24 and the p-side junction electrode 25 formed on the n-side flattening electrode 22 and the p-side flattening electrode 23, respectively, is further reduced, and adhesion between the junction electrode and the package is improved, thereby suppressing the peeling.

Next, the surfaces of the n-side flattening electrode 22 and the p-side flattening electrode 23 are irradiated with a reducing gas plasma to remove the oxide film formed on the surfaces of the n-side flattening electrode 22 and the p-side flattening electrode 23. The oxide film is formed by oxidation of the surfaces of the n-side flattening electrode 22 and the p-side flattening electrode 23 due to heat generated through grinding. The reducing gas is, for example, hydrogen or oxyhydrogen.

The process for removing the oxide film is not necessarily required. However, by removing the oxide film, adhesion between the n-side flattening electrode 22 and the n-side junction electrode 24, and between the p-side flattening electrode 23 and the p-side junction electrode 25 can be improved, and conductivity therebetween can also be improved.

Figure 4C:
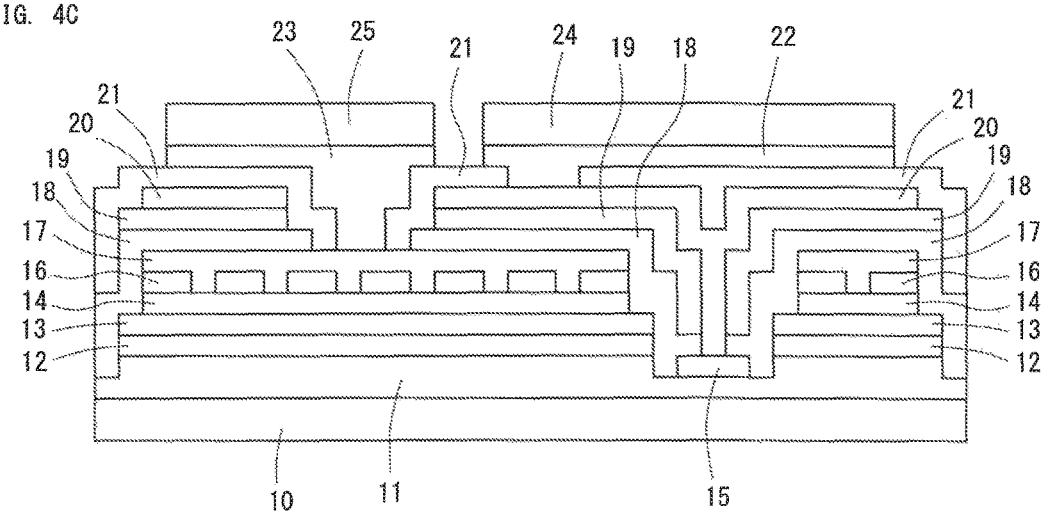

An n-side junction electrode 24 and a p-side junction electrode 25 are formed by vapor deposition and lift-off on the n-side flattening electrode 22 and the p-side flattening electrode 23, respectively (refer to FIG. 4C). Since the surfaces of the n-side flattening electrode 22 and the p-side flattening electrode 23 are flattened, the surfaces of the n-side junction electrode 24 and the p-side junction electrode 25 are flat so that the thickness is uniform. The thickness of the n-side junction electrode 24 and the p-side junction electrode 25 is preferably 1 µm to 5 µm. Within this range, when mounting the light-emitting device to the package, the n-side junction electrode 24 and the p-side junction electrode 25 can be sufficiently adhered to the package, and pn short-circuit caused by protrusion of the n-side junction electrode 24 and the p-side junction electrode 25 melted during heating and pressing can be suppressed. The thickness is more preferably 1 µm to 3 µm, and further preferably, 1 µm to 2 µm.

After the formation of the n-side junction electrode 24 and the p-side junction electrode 25, the surfaces of the n-side junction electrode 24 and the p-side junction electrode 25 may be more flat by grinding the surfaces.

After that, an antioxidation film made of Au or the like may be formed on the surfaces of the n-side junction electrode 24 and the p-side junction electrode 25. By forming the antioxidation film, the formation of an oxide film on the surfaces of the n-side junction electrode 24 and the p-side junction electrode 25 can be suppressed, and the generation of bonding defects can be suppressed. Through the above, the light-emitting device according to Embodiment 1 is produced.

By the method for producing a light-emitting device according to Embodiment 1, the unevenness on the surfaces of the n-side junction electrode 24 and the p-side junction electrode 25 can be reduced. As a result, when the light-emitting device is bonded to the package, the unbonded portions of the n-side junction electrode 24 and the p-side junction electrode 25 can be reduced, and peeling off of the light-emitting device from the package can be reduced. Since the contact area of the n-side junction electrode 24 and the p-side junction electrode 25 with the package is increased, thermal resistance becomes small, thereby extending the service life of the light-emitting device.

When the light-emitting device is bonded to the package, the n-side junction electrode 24 and the p-side junction electrode 25 are melted. When the thicknesses of the n-side junction electrode 24 and the p-side junction electrode 25 are not uniform, melt flows so that the thick portion becomes thicker and the thin portion becomes thinner. Therefore, various defects such as generation of unbonded portion are induced. On the other hand, in the light-emitting device according to Embodiment 1, since the n-side flattening electrode 22 and the p-side flattening electrode 23 are formed, the thicknesses of the n-side junction electrode 24 and the p-side junction electrode 25 are uniform. As a result, even if the n-side junction electrode 24 and the p-side junction electrode 25 are melted, the thicknesses are still uniform, and can be uniformly bonded to the package.

Since the surfaces of the n-side junction electrode 24 and the p-side junction electrode 25 are flattened, they can be sufficiently bonded to the package without applying large pressure. Therefore, short-circuit caused by protrusion of the n-side junction electrode 24 and the p-side junction electrode 25 in the lateral direction due to pressing force can be suppressed.

Embodiment 2

The method for producing a light-emitting device according to Embodiment 2 is changed as follows from the method for producing a light-emitting device according to Embodiment 1. Since the same processes as in Embodiment 1 are carried out until forming the n-side junction electrode 24 and the p-side junction electrode 25 in FIG. 4C, their descriptions are omitted.

Figure 5A:
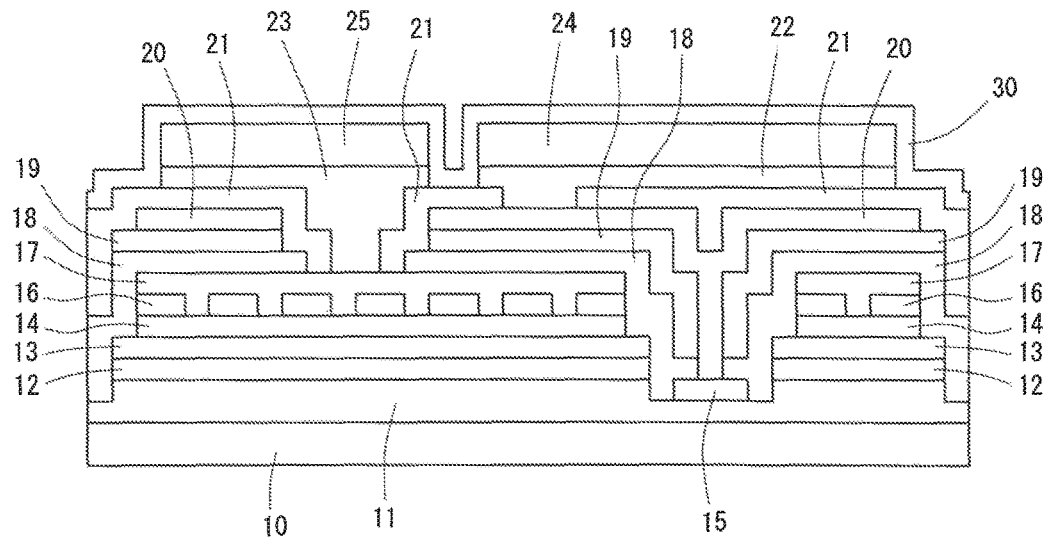
FIGS. 5A and 5B are sketches showing production processes of a light-emitting device according to Embodiment 2.

After the formation of the n-side junction electrode 24 and the p-side junction electrode 25, a protective film 30 is formed so as to continuously cover the top surfaces and the side surfaces of the n-side junction electrode 24 and the p-side junction electrode 25, and the side surfaces of the n-side flattening electrode 22 and the p-side flattening electrode 23 (refer to FIG. 5A). The protective film 30 is formed of $Al_2O_3$ through ALD. The thickness of the protective film 30 is 300 nm. By using ALD, the protective film 30 can be formed so as to have an uniform thickness along the shapes of the n-side junction electrode 24, the p-side junction electrode 25, the n-side flattening electrode 22, and the p-side flattening electrode 23.

The material of the protective film 30 is not limited to $Al_2O_3$, and any insulating material such as $SiO_2$, $TiO_2$, $ZrO_2$, and SiN may be used. However, since $Al_2O_3$ shows low gas or water permeability and high migration suppressing effect of electrode, the protective film 30 is preferably made of $Al_2O_3$. The film formation method is not limited to ALD, and CVD may be employed. The thickness of the protective film 30 is not limited to 300 nm. To achieve easiness in grinding in the subsequent step or sufficient insulating properties, the thickness is preferably 0.1 µm to 1 µm, more preferably, 0.1 µm 0.5 µm, and further preferably, 0.2 µm to 0.5 µm.

Figure 5B:
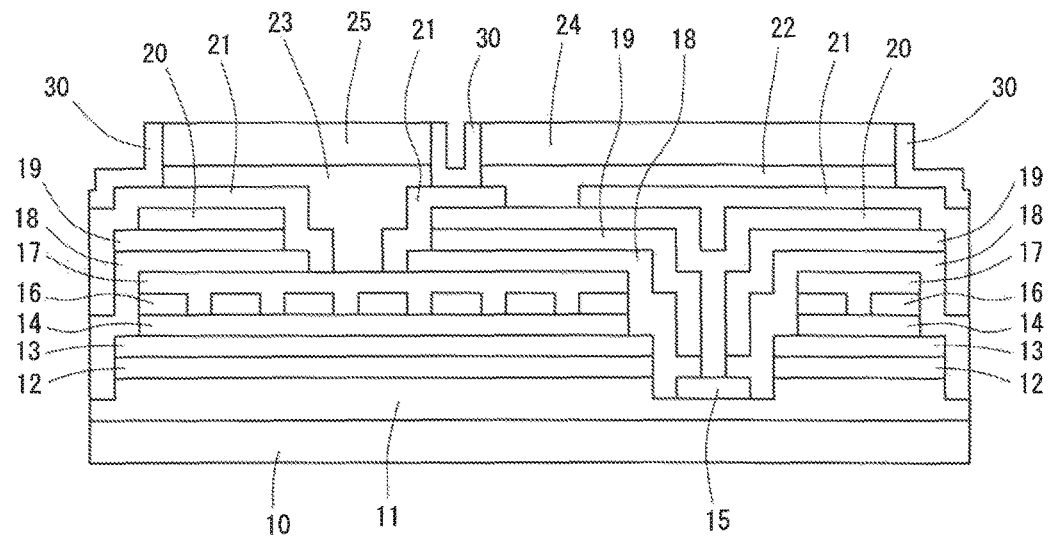

Next, the protective film 30 is ground, to expose the surfaces of the n-side junction electrode 24 and the p-side junction electrode 25 (refer to FIG. 5B). Diamond bite or grinding wheel may be used for grinding. At this time, the surfaces of the n-side junction electrode 24 and the p-side junction electrode 25 are also ground to become thin. Therefore, the n-side junction electrode 24 and the p-side junction electrode 25 are preferably formed so as to have a thickness of 3 µm or more, more preferably, 3 µm to 10 µm, and further preferably, 4 µm to 6 µm.

After that, as in Embodiment 1, the oxide film is removed by plasma treatment from the surfaces of the n-side junction electrode 24 and the p-side junction electrode 25, an antioxidation film made of Au is formed on the n-side junction electrode 24 and the p-side junction electrode 25. Through the above, the light-emitting device according to Embodiment 2 is produced.

By the method for producing a light-emitting device according to Embodiment 2, the following problems can be solved. Since AuSn used in the n-side junction electrode 24 and the p-side junction electrode 25 contains Sn, migration easily occurs, thereby causing a reliability problem, for example, a short circuit of the pn junction. In Embodiment 2, the side surfaces of the n-side flattening electrode 22, the p-side flattening electrode 23, the n-side junction electrode 24, and the p-side junction electrode 25 are covered with an insulator by forming a protective film 30, thereby preventing a short circuit of the pn junction.

Variations

The present invention is not limited to the structures of the light-emitting device of Embodiments 1 and 2. The present invention is applicable to any structure as long as the light-emitting device has a semiconductor layer formed by sequentially depositing an n-type layer, a light-emitting layer, and a p-type layer, an insulating film formed on the semiconductor layer, an n-side junction electrode and a p-side junction electrode formed on the insulating film, wherein the n-type layer is connected to the n-side junction electrode via holes formed in the insulating film and the semiconductor layer, and the p-type layer is connected to the p-side junction electrode via holes formed in the insulating film. For example, the light-emitting device of Embodiment 1 has a structure in which the n-electrode and the p-electrode come into point contact with the n-type layer and the p-type layer via the insulating film. However, the present invention is also applicable to a line contact structure.

The light-emitting device according to the present invention can be employed as a light source of an illumination apparatus or a display apparatus.

What is claimed is:

1. A method for producing a light-emitting device comprising a semiconductor layer formed by sequentially depositing an n-type layer, a light-emitting layer, and a p-type layer, an insulating film formed on the semiconductor layer, and an n-side junction electrode and a p-side junction electrode formed on the insulating film, wherein the n-type layer is connected to the n-side junction electrode via n-side holes formed in the insulating film and the semiconductor layer, and the p-type layer is connected to the p-side junction electrode via p-side holes formed in the insulating film, the method including:

forming an n-side flattening electrode being connected to the n-type layer via the n-side holes and a p-side flattening electrode being connected to the p-type layer via the p-side holes so as to be apart from each other on the insulating film;

grinding and flattening a surface of the n-side flattening electrode and a surface of the p-side flattening electrode; and forming an n-side junction electrode on the surface of the n-side flattening electrode and a p-side junction electrode on the surface of the p-side flattening electrode, respectively.

2. The method for producing a light-emitting device according to claim 1, wherein in the grinding, the recesses on the surfaces of the n-side flattening electrode and the p-side flattening electrode are ground so as to have a depth of 100 nm or less.

3. The method for producing a light-emitting device according to claim 2, the method further including removing an oxide film formed on the surface of the n-side flattening electrode and an oxide film formed on the surface of the p-side flattening electrode by irradiating the surface of the n-side flattening electrode and the surface of the p-side flattening electrode with a reducing gas plasma before the forming junction electrodes after the grinding.

4. The method for producing a light-emitting device according to claim 2, the method further including forming an antioxidation film on a surface of the n-side junction electrode and an antioxidation film on a surface of the p-side junction electrode.

5. The method for producing a light-emitting device according to claim 2, wherein the n-side flattening electrode and the p-side flattening electrode are formed so as to have a thickness twice or more a height from a surface of the p-type layer to a surface of the insulating film.

6. The method for producing a light-emitting device according to claim 1, the method further including removing an oxide film formed on the surface of the n-side flattening electrode and an oxide film formed on the surface of the p-side flattening electrode by irradiating the surface of the n-side flattening electrode and the surface of the p-side flattening electrode with a reducing gas plasma before the forming junction electrodes after the grinding.

7. The method for producing a light-emitting device according to claim 6, the method further including forming an antioxidation film on a surface of the n-side junction electrode and an antioxidation film on a surface of the p-side junction electrode.

8. The method for producing a light-emitting device according to claim 6, wherein the n-side flattening electrode and the p-side flattening electrode are formed so as to have a thickness twice or more a height from a surface of the p-type layer to a surface of the insulating film.

9. The method for producing a light-emitting device according to claim 1, the method further including forming an antioxidation film on a surface of the n-side junction electrode and an antioxidation film on a surface of the p-side junction electrode.

10. The method for producing a light-emitting device according to claim 9, wherein the n-side flattening electrode and the p-side flattening electrode are formed so as to have a thickness twice or more a height from a surface of the p-type layer to a surface of the insulating film.

11. The method for producing a light-emitting device according to claim 1, wherein the n-side flattening electrode and the p-side flattening electrode are formed so as to have a thickness twice or more a height from a surface of the p-type layer to a surface of the insulating film.

12. The method for producing a light-emitting device according to claim 1, wherein the insulating film comprises a first insulating film and a second insulating film, the method includes:

forming a transparent electrode on the p-type layer;

forming a dielectric multilayer film having through holes, which reflects a light emitted from the light-emitting layer, on the transparent electrode;

forming a p-electrode contacting with the transparent electrode via the through holes on the dielectric multilayer film;

forming the first insulating film on the p-electrode;

forming a reflection film on the first insulating film;

forming an n-wiring electrode on the reflection film, the n-wiring electrode contacting with the n-type layer and the n-side flattening electrode;

forming the second insulating film on the n-wiring electrode, the second insulating film covering the n-wiring electrode and the reflection film with the first insulating film; and forming the n-side flattening electrode and the p-side flattening electrode on the second insulating film.

13. The method for producing a light-emitting device according to claim 1, wherein the n-side flattening electrode and the p-side flattening electrode are made of at least one selected from a group consisting of a double layer of a Ti layer and an Au layer, a double layer of a Ti layer and an Al layer, and a double layer of a Ti layer and a Cu layer, the Ti layer contacting with the second insulating film.

* * * * *